United States Patent
Yoshitoku et al.

(10) Patent No.: US 8,871,537 B2
(45) Date of Patent: Oct. 28, 2014

(54) METHOD OF MANUFACTURING AN ORGANIC ELECTROLUMINESCENCE DISPLAY DEVICE

(75) Inventors: Daisuke Yoshitoku, Mobara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 13/613,812

(22) Filed: Sep. 13, 2012

(65) Prior Publication Data

US 2013/0084664 A1    Apr. 4, 2013

(30) Foreign Application Priority Data

Sep. 30, 2011  (JP) ................................. 2011-217678
Aug. 31, 2012  (JP) ................................. 2012-191772

(51) Int. Cl.
- *H01L 21/00* (2006.01)
- *H01L 31/036* (2006.01)
- *H01L 29/04* (2006.01)
- *H01L 27/32* (2006.01)
- *H01L 51/00* (2006.01)

(52) U.S. Cl.
CPC ........ *H01L 27/3211* (2013.01); *H01L 51/0018* (2013.01)
USPC ................... 438/29; 428/34; 428/39; 257/59; 257/72

(58) Field of Classification Search
USPC ..................... 438/29, 34, 39; 257/59, 72, 222
See application file for complete search history.

(56) References Cited

U.S. PATENT DOCUMENTS 7,736,921 B2 *  6/2010  Tachikawa et al. ............. 438/29
2011/0095279 A1  4/2011  Mizuno et al.

FOREIGN PATENT DOCUMENTS

JP        4507759 B       7/2010

* cited by examiner

*Primary Examiner* — Hsien Ming Lee
(74) *Attorney, Agent, or Firm* — Fitzpatrick, Cella, Harper & Scinto

(57) ABSTRACT

Provided is a method of manufacturing an organic electroluminescence display device which enables production of a high-resolution organic electroluminescence display device in which display failure is suppressed. The method of manufacturing an organic electroluminescence display device includes multiple organic electroluminescence elements each including an organic compound layer that includes at least an emission layer, the method including: forming the organic compound layer on a substrate; sequentially forming an intermediate layer and a resist layer on the organic compound layer; removing a part of the resist layer by a photolithography method; and selectively removing, by dry etching, the intermediate layer and the organic compound layer in a region in which the part of the resist layer is removed, the light shielding layer having a function of blocking light having a wavelength of 190 nm or more and 360 nm or less.

9 Claims, 2 Drawing Sheets

METHOD OF MANUFACTURING AN ORGANIC ELECTROLUMINESCENCE DISPLAY DEVICE

BACKGROUND OF THE INVENTION

1. Field of the Invention

The present invention relates to a method of manufacturing an organic electroluminescence (EL) display device.

2. Description of the Related Art

An organic EL element that is a component of an organic EL display device includes a first electrode formed as a lower electrode, a stacked structure (organic compound layer) which is made of an organic compound and includes at least an emission layer, and a second electrode formed as an upper electrode, which are stacked on a substrate in the stated order. In this case, the emission layer forming the organic EL element is formed into a desired pattern by using, for example, an evaporation method performed via a shadow mask, a selective coating method by ink jetting, or a photolithography method. Of those methods, when the photolithography method is used, in order to protect the emission layer against a solution containing a photoresist, an intermediate layer is formed between a resist layer and the emission layer. Note that, after the resist layer is patterned, the intermediate layer is subjected to dry etching together with the organic emission layer to be processed (partially removed).

By the way, when the photolithography method is used, the emission layer is irradiated with ultraviolet rays when the photoresist is patterned, and is irradiated with plasma light when the intermediate layer and the emission layer are subjected to dry etching. At this time, short-wavelength light contained in the ultraviolet rays and the plasma light may cause reactions such as degradation and recombination of materials forming the emission layer, which may cause damage such as structure change of the emission layer. When the emission layer is damaged by the ultraviolet light and the plasma light, luminous efficiency of the organic EL element may be lowered and the durability thereof may be deteriorated.

Therefore, various proposals have been conventionally made for protection of the emission layer against ultraviolet light and plasma light. For example, in Japanese Patent No. 4507759, there is proposed a method in which, in a case where the emission layer is patterned by a photolithography method, the intermediate layer is formed so as to contain a light absorbing material so that the light absorbing material absorbs the ultraviolet light and the plasma light.

By the way, in Japanese Patent No. 4507759, as a specific constituent material for the intermediate layer, a water-soluble polymer is employed. However, an inorganic pigment that is the light absorbing material to be added to the intermediate layer made of a water-soluble polymer is made of a metal oxide, a salt of metal, or the like, and has a property of being resistant to etching with an $O_2$ gas. Therefore, the inorganic pigment to be added as the light absorbing material has an etching rate smaller than that of the water-soluble polymer to be subjected to etching with the $O_2$ gas, and hence the inorganic pigment is difficult to be subjected to collective etching with the water-soluble polymer. As a result, the inorganic pigment remains as a residue when the dry etching with the $O_2$ gas is performed, which may cause a short-circuit between the first electrode and the second electrode. Thus, display failure occurs in some cases.

SUMMARY OF THE INVENTION

The present invention has been made to solve the above-mentioned problem, and therefore has an object to provide a method of manufacturing an organic EL display device which enables production of a high-resolution organic EL display device in which display failure is suppressed.

According to an exemplary embodiment of the present invention, there is provided a method of manufacturing an organic electroluminescence display device including multiple organic electroluminescence elements each including an organic compound layer that includes at least an emission layer, the method including:

forming the organic compound layer on a substrate;

sequentially forming an intermediate layer and a resist layer on the organic compound layer;

removing a part of the resist layer by a photolithography method; and selectively removing, by dry etching, the intermediate layer and the organic compound layer in a region in which the part of the resist layer is removed, in which the intermediate layer includes at least a light shielding layer, and the light shielding layer has a function of blocking light having a wavelength of 190 nm or more and 360 nm or less.

According to the manufacturing method of the present invention, it is possible to suppress damage to the organic compound layer including the emission layer due to ultraviolet light applied at the time of exposure or dry etching, and further realize patterning that does not generate a residue of a light absorbing material. With this, it is possible to produce the high-resolution organic EL display device in which the display failure is suppressed.

Therefore, according to the present invention, it is possible to provide the method of manufacturing an organic EL display device which enables the production of the high-resolution organic EL display device in which the display failure is suppressed.

Further features of the present invention will become apparent from the following description of exemplary embodiments with reference to the attached drawings.

DESCRIPTION OF THE EMBODIMENTS

A method of manufacturing an organic EL display device according to the present invention includes a step of forming a first electrode, a step of forming an organic compound layer including an emission layer, a step of forming an intermediate layer, a step of forming a pattern of a photoresist layer, a step of processing the intermediate layer, and a step of processing the organic compound layer.

In the method of manufacturing an organic EL display device according to the present invention, the step of processing the organic compound layer is a step of removing the organic compound layer in a region in which the photoresist layer is removed in the step of forming the pattern of the photoresist layer. Further, in the method of manufacturing an organic EL display device according to the present invention, the step of processing the intermediate layer is a step of removing the intermediate layer in the region in which the photoresist layer is removed in the step of forming the pattern of the photoresist layer.

Further, in the method of manufacturing an organic EL display device according to the present invention, the intermediate layer to be formed is a stacked body formed of multiple layers including at least a light shielding layer and a release layer. In this case, the light shielding layer included in the intermediate layer has a function of blocking light having a wavelength of at least 190 nm or more and 360 nm or less.

When a high-resolution patterning is performed by a photolithography method, an exposure light source which emits short-wavelength light is used. The C(carbon)-C bond, which is the main skeleton of organic matters, has a bond energy of about 3.50 eV, and a wavelength of about 360 nm has a photon energy of 3.50 eV. Therefore, when light having a wavelength of 360 nm or less is applied to the emission layer, reactions such as degradation and recombination of materials forming the emission layer may occur, which may cause structure change of the emission layer.

To address this problem, in the invention of this application, the light shielding layer is provided to block light having a wavelength of 360 nm or less of light to be applied to the emission layer during the process, and thus the emission layer is prevented from being damaged during the process.

In the following, a method of manufacturing an organic EL display device according to an embodiment of the present invention is described with reference to the drawings. Note that, known or publicly-known technologies of the related art can be applied to parts particularly not described or illustrated in this specification or the drawings. Further, the embodiment described below is merely one specific example of embodiments of the present invention, and the present invention is not limited to the embodiment.

Figure 1:
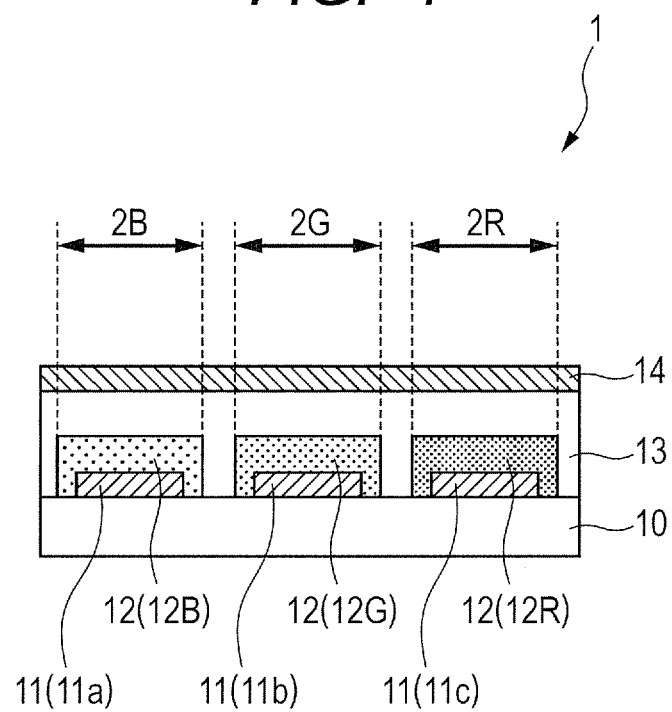
FIG. 1 is a schematic sectional view illustrating an example of an organic EL display device to be manufactured by a method of manufacturing an organic EL display device according to the present invention.

FIG. 1 is a schematic sectional view illustrating an example of an organic EL display device to be manufactured by the method of manufacturing an organic EL display device according to the present invention.

An organic EL display device 1 of FIG. 1 includes three types of sub-pixels, specifically, a blue sub-pixel 2B, a green sub-pixel 2G, and a red sub-pixel 2R. However, in the present invention, the types of the sub-pixels are not limited to the three types illustrated in FIG. 1. Note that, FIG. 1 illustrates the organic EL display device 1 including one sub-pixel for each type (2B, 2G, and 2R), but actually, the organic EL display device 1 of FIG. 1 includes multiple sub-pixels for each type (2B, 2G, and 2R). Further, in the organic EL display device 1 of FIG. 1, an aggregate of each one of the sub-pixels (2B, 2G, and 2R) forms a pixel. Multiple pixels are arranged based on a predetermined arrangement rule, and thus the organic EL display device 1 of FIG. 1 is formed.

Each of the sub-pixels (2B, 2G, and 2R) included in the organic EL display device 1 of FIG. 1 includes an organic EL element. Note that, the organic EL element is an electronic element including a first electrode 11, an organic compound layer 12, an electron injection transport layer 13, and a second electrode 14, which are stacked on a substrate 10 in the stated order.

Note that, in the organic EL display device 1 of FIG. 1, the first electrode 11 is an electrode provided independently for each sub-pixel. That is, the blue sub-pixel 2B, the green sub-pixel 2G, and the red sub-pixel 2R include a first electrode 11a, a first electrode 11b, and a first electrode 11c, respectively.

Further, in the organic EL display device 1 of FIG. 1, the organic compound layer 12 is classified into a blue organic compound layer 12B, a green organic compound layer 12G, and a red organic compound layer 12R depending on the types of the sub-pixels (2B, 2G, and 2R). In this case, the blue organic compound layer 12B, the green organic compound layer 12G, and the red organic compound layer 12R represent organic compound layers made of luminescent materials having emission wavelengths in ranges of 435 nm to 480 nm, 500 nm to 560 nm, and 610 nm to 750 nm, respectively. Note that, the emission wavelength herein refers to a maximum wavelength of the emission spectrum to be emitted from each luminescent material.

Figure 2A:
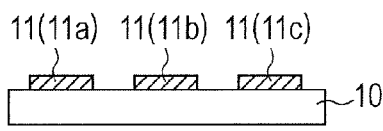
FIGS. 2A, 2B, 2C, 2D, 2E, 2F, 2G, 2H, 2I, 2J, 2K, 2L, 2M and 2N are schematic sectional views illustrating steps of manufacturing the organic EL display device illustrated in FIG. 1.
Figure 2B:
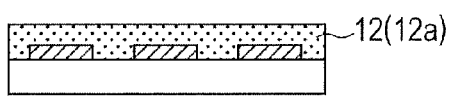
Figure 2C:
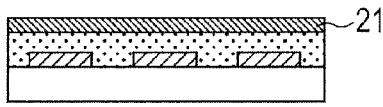
Figure 2D:
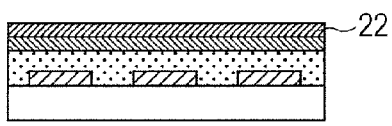
Figure 2E:
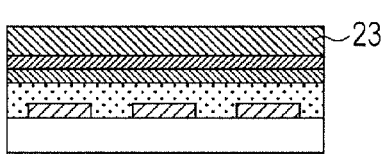
Figure 2F:
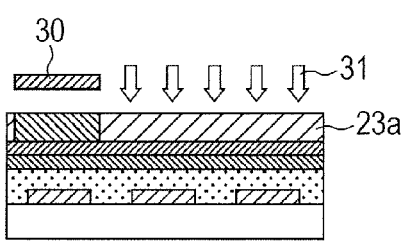
Figure 2G:
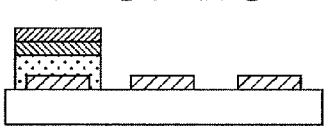
Figure 2H:
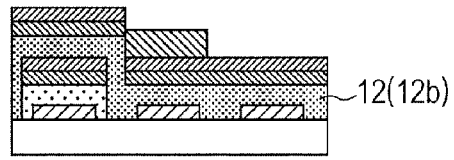
Figure 2I:
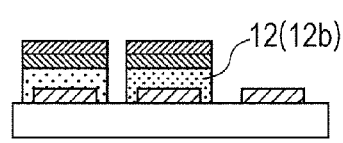
Figure 2J:
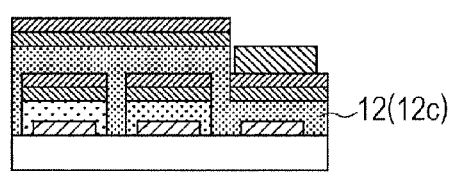
Figure 2K:
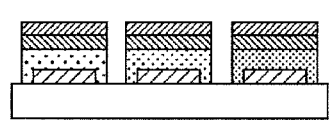
Figure 2L:
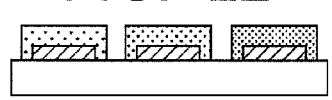
Figure 2M:
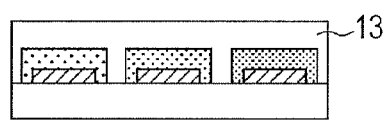
Figure 2N:
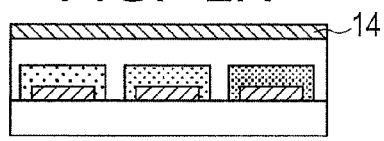

FIGS. 2A to 2N are schematic sectional views illustrating steps of manufacturing the organic EL display device of FIG. 1. In the following, the manufacturing method according to the embodiment of the present invention is described with reference to FIGS. 2A to 2N.

(Substrate)

When the organic EL display device is produced based on the manufacturing method of the present invention, the substrate 10 is not particularly limited, but the substrate is required to enable stable manufacture of the organic EL display device and not affect driving of the organic EL display device. For example, an insulating substrate such as glass and an Si wafer is suitably used.

Note that, in the present invention, on a surface that is a main surface of the substrate 10 or inside the substrate 10, a circuit element (not shown) may be provided, which is necessary for causing light emission of the organic EL element, such as a transistor functioning as a switching element. In this case, the circuit element necessary for causing light emission of the organic EL element, such as a transistor, can be formed with use of a publicly-known method. Further, pixel circuits formed by combining a series of the above-mentioned circuit elements necessary for causing light emission of the organic EL element are two-dimensionally arranged so as to correspond to the respective sub-pixels. Further, the pixel circuits are each electrically connected to the first electrode 11 and the second electrode 14. Note that, when the above-mentioned pixel circuits are provided on the surface that is the main surface of the substrate 10 or inside the substrate 10, a planarizing layer (not shown) for planarizing the irregularities generated by the pixel circuits may be provided as necessary.

(Step of Forming First Electrode)

When the organic EL display device is produced based on the manufacturing method of the present invention, first, the first electrode 11 corresponding to the lower electrode is formed on the substrate 10 (FIG. 2A).

A constituent material for the first electrode 11 is not particularly limited, and may be a transparent electrode or a reflective electrode depending on a light radiating direction. Further, the first electrode 11 may be a stacked electrode formed by stacking the reflective electrode and the transparent electrode.

In a case where light is radiated from the substrate 10 side, the first electrode 11 may be a transparent electrode or a semi-transparent electrode, and a constituent material therefor is particularly preferred to be a material having high light transparency. The transparent electrode herein refers to an electrode having a transmittance of 80% or more with respect to visible light, and the semi-transparent electrode herein refers to an electrode having a transmittance of 20% or more and less than 80% with respect to visible light. Examples of the constituent material for the first electrode 11 include an indium tin oxide, an indium zinc oxide, a transparent electrode material containing those oxides, and a thin metal layer having a thickness of about 1 nm to 10 nm. Further, when the first electrode 11 is a transparent electrode, it is preferred that the thickness of the first electrode 11 be 10 nm to 100 nm.

In a case where the light is radiated from a side opposite to the substrate 10, the first electrode 11 is preferred to be a reflective electrode having a reflectance of 80% or more with respect to visible light, and a constituent material therefor is particularly preferred to be a material having high light reflectivity (high reflectance material). This is because, when the first electrode 11 is a reflective electrode, as a reflectance of an electrode material that is the constituent material for the electrode becomes higher, the light extraction efficiency of the organic EL display device can be improved. Examples of the material having high light reflectivity used as the constituent material for the first electrode 11 include an elemental metal such as Cr, Al, Ag, Au, and Pt, and an alloy obtained by combining multiple types of those elemental metals. In this case, from the viewpoint of reflectance, an Ag alloy is preferred. Further, from the viewpoint of ease of workability, an Al alloy is preferred. When the first electrode 11 is a reflective electrode, the thickness of the first electrode 11 is preferred to be 50 nm to 300 nm.

When the first electrode 11 is a stacked electrode and is desired to function as the reflective electrode, it is preferred that a reflective electrode material and a transparent electrode material be stacked on the substrate 10 in the stated order.

The first electrode 11 can be formed as follows. For example, a thin film made of an electrode material is formed by a publicly-known method such as a sputtering method, and with use of a thin film processing measure such as a photolithography method, the thin film is processed into a desired shape as the first electrodes 11a to 11c illustrated in FIG. 2A.

(Step of Forming Organic Compound Layer)

After the first electrode 11 is formed as described above, a step of forming a thin film that becomes the organic compound layer 12 on at least the first electrode 11 is performed (FIG. 2B).

The organic compound layer 12 may be formed of a single layer or multiple layers as long as at least the emission layer is included, which may be selected as appropriate in consideration of the emission function of the organic EL element. Specific examples of the layers forming the organic compound layer 12 include the emission layer, a hole injection layer, and a hole transport layer. Note that, the organic compound layer 12 can be set so that any one of the layer configuration, the emission color, and the like is different depending on the type of the sub-pixel. Specifically, the blue sub-pixel 2B, the green sub-pixel 2G, and the red sub-pixel 2R include the blue organic compound layer 12B, the green organic compound layer 12G, and the red organic compound layer 12R, respectively.

As a constituent material for the organic compound layer 12, a publicly-known material can be used. Further, the organic compound layer 12 is formed by a vacuum evaporation method and the like.

(Step of Processing Organic Compound Layer)

After the organic compound layer 12 is formed, the organic compound layer 12 is processed into a desired pattern by a process represented by the following items (i) to (v):

(i) a step of forming a release layer 21 (FIG. 2C);
(ii) a step of forming a light shielding layer 22 (FIG. 2D);
(iii) a step of forming a resist layer 23 (FIG. 2E);
(iv) an exposure and development step (FIG. 2F); and
(v) an etching step (FIG. 2G).

Note that, the release layer 21 and the light shielding layer 22, in particular, the light shielding layer 22, have a function as an intermediate layer for protecting the organic compound layer 12 against a solution containing a photoresist to be used in the step of forming the resist layer 23. That is, both of the step of forming the release layer 21 and the step of forming the light shielding layer 22 can be restated as a step of forming the intermediate layer. Further, the intermediate layer is not limited to have a double-layer configuration of the release layer 21 and the light shielding layer 22, and an interposing layer may be provided as necessary. In the following, the process represented by the items (i) to (v) is described.

<Step of Forming Release Layer>

After the organic compound layer 12 is formed, the release layer 21 is formed on the organic compound layer 12 (FIG. 2C). For the release layer 21, a material soluble in a solvent which hardly dissolves the constituent material for the organic compound layer 12 is selected.

For example, when the constituent material for the organic compound layer 12 is a material which is poorly soluble in water, such as an arylamine derivative, a stilbene derivative, polyarylene, and a fused polycyclic hydrocarbon compound, it is preferred that a material which is soluble in water be used as a constituent material for the release layer 21.

Examples of the material which is soluble in water and is to be used as the constituent material for the release layer 21 include a water-soluble polymer such as a polyvinyl alcohol (PVA), a polyvinylpyrrolidone (PVP), a polyvinyl caprolactam (PVCAP), a polyethylene glycol (PEG), and a vinylpyrrolidone copolymer.

<Step of Forming Light Shielding Layer>

After the release layer 21 is formed, the light shielding layer 22 is formed on the release layer 21 (FIG. 2D). The light shielding layer 22 has a function of blocking light which may damage the organic compound layer 12. Specifically, the light shielding layer 22 has a function of blocking light having a wavelength of 360 nm or less, which has an energy higher than the bond energy of the C(carbon)-C bond being the main skeleton of organic matters.

Further, the light shielding layer 22 is preferred to have a transmittance of about 5% or less with respect to light having a wavelength of 360 nm or less, but is only required to have such a function that a transmittance thereof is at least about 5% or less with respect to light having a wavelength of 190 nm or more and 360 nm or less that is measurable by a device. It is more preferred that the light shielding layer 22 have such a function that a transmittance thereof is 1% or less with respect to light having a wavelength range of 190 nm or more to 360 nm or less.

The light shielding layer 22 having the above-mentioned function is provided on the release layer 21, and thus the organic compound layer 12 can be protected against ultraviolet rays to be used in the exposure and development step described later, and light to be used in the etching step described later. Further, the light shielding layer 22 can protect the organic compound layer 12 against plasma light or the like to be used when another light shielding layer 22 is formed for patterning the organic compound layer 12 of the second or subsequent color.

As a constituent material for the light shielding layer 22, a material which absorbs or reflects, or absorbs and reflects the light having the wavelength of 190 nm or more and 360 nm or less may be used. Specific examples of the absorbing and reflective material include aluminium (Al), titanium (Ti), and molybdenum (Mo). Examples of the material mainly used as the absorbing material include: inorganic materials such as carbon (C), amorphous silicon, silicon, and nitride; aromatic organic compounds such as porphyrin, phthalocyanine, pentacene, and perylene; and organic high-molecular compounds such as a polyparaphenylene vinylene.

Further, when the light shielding layer 22 is formed, it is necessary to select a material and a producing method therefor which do not affect the release layer 21 to be altered or dissolved. In this case, when a water-soluble polymer is used as the constituent material for the release layer 21, if the light shielding layer 22 is formed by a wet process using water, the release layer 21 may be dissolved. Therefore, it is preferred that the light shielding layer 22 be formed by a wet process using a hydrophobic organic solvent such as toluene or a hydrophilic organic solvent such as acetone and tetrahydrofuran, or a dry process such as a sputtering method, a CVD method, and a PVD method.

The light shielding layer 22 may have a single layer configuration or a stacked configuration. From the viewpoint of the number of steps, the single layer configuration is preferred because the number of forming steps can be reduced. From the viewpoint of ease of workability, the stacked configuration is preferred. This is because, by selecting the materials, it becomes easy to control an edge taper of the light shielding layer 22 generated after the light shielding layer 22 is subjected to etching, which accordingly enables control of the reduction amount of the organic compound layer 12 and the release layer 21 when those layers are subjected to etching. Note that, when the stacked configuration is employed for the light shielding layer 22, the stack order is not particularly limited.

Further, the thickness of the light shielding layer 22 is not particularly limited as long as the thickness is within a range for obtaining a desired light shielding performance. In this case, for example, the following expression may be satisfied:

$$T_1 > T_2 (\text{or } T_3) > T_3 (\text{or } T_2)$$

where $T_1$ represents a thickness of the light shielding layer of the first color, $T_2$ represents a thickness of the light shielding layer of the second color, and $T_3$ represents a thickness of the light shielding layer of the third color. Alternatively, $T_2 > T_3$ (or $T_1$) $> T_1$ (or $T_3$) may be satisfied. Alternatively, $T_3 > T_1$ (or $T_2$) $> T_2$ (or $T_1$) may be satisfied. The expression to be adopted may be selected as appropriate depending on the process conditions.

The layer configuration of the light shielding layer 22 may be changed for each type of the sub-pixels. For example, when m (m is an arbitrary natural number) light shielding layers 22 are provided for the sub-pixel of the first color, m+1 light shielding layers 22 may be provided for the sub-pixel of the second color, and m+2 light shielding layers 22 may be provided for the sub-pixel of the third color. Alternatively, when m light shielding layers 22 are provided for the sub-pixel of the second color, m+1 light shielding layers 22 may be provided for the sub-pixel of the first (or third) color, and m+2 light shielding layers 22 may be provided for the sub-pixel of the third (or first) color. Alternatively, when m light shielding layers 22 are provided for the sub-pixel of the third color, m+1 light shielding layers 22 may be provided for the sub-pixel of the first (or second) color, and m+2 light shielding layers 22 may be provided for the sub-pixel of the second (or first) color. As described above, the forming conditions of the light shielding layer 22 may be selected as appropriate depending on the process conditions. Further, also in this case, the stack order is not particularly limited.

Further, the layer configuration of the light shielding layer 22 may be different in only one color. For example, m (m is an arbitrary natural number) light shielding layers 22 may be provided for the sub-pixel of the first color, and n (n is an arbitrary natural number) light shielding layers 22 may be provided for the sub-pixels of the second and third colors. Alternatively, m light shielding layers 22 may be provided for the sub-pixel of the second color, and n light shielding layers 22 may be provided for the sub-pixels of the first and third colors. Alternatively, m light shielding layers 22 may be provided for the sub-pixel of the third color, and n light shielding layers 22 may be provided for the sub-pixels of the first and second colors. Also in this case, the forming conditions of the light shielding layer 22 may be selected as appropriate depending on the process conditions. Further, the stack order is not particularly limited.

Moreover, the above-mentioned layer configuration of the release layer 21 and thickness configuration of the light shielding layer 22 may be combined as appropriate. Also in this case, as long as the light shielding layer has a desired light shielding function, the thickness of each layer forming the light shielding layer 22 is not particularly limited.

<Step of Forming Resist Layer>

Next, a photoresist material is coated on the light shielding layer 22 to form the resist layer 23 (FIG. 2E). Examples of the photoresist-material coating method include a spin-coating method, a dipping method, and a slit-coating method, but the coating method is not particularly limited thereto. Further, as the photoresist material, publicly-known positive-type photoresist material and negative-type photoresist material may be used.

<Exposure and Development Step>

Next, the resist layer 23 formed in the previous step is subjected to exposure with use of a photomask 30, and is then subjected to development. Thus, an exposed part 23a of the resist layer 23 is selectively removed, and thus the resist layer 23 is patterned (FIG. 2F). Light 31 to be used in this step is mainly ultraviolet light, but is not particularly limited thereto as long as the light causes photoreaction of the photoresist forming the resist layer 23.

<Etching Step>

Next, with use of the photoresist that has been patterned in the previous step as a mask, the light shielding layer 22, the release layer 21, and the organic compound layer 12 are sequentially removed by etching (FIG. 2G). The etching method is not particularly limited as long as the organic compound layer 12 can be processed into a desired shape as illustrated in FIG. 2G. For example, dry etching or wet etching may be used to collectively remove the light shielding layer 22, the release layer 21, and the organic compound layer 12 by the etching, or dry etching and wet etching may be used in combination for removal by etching.

Further, the patterned photoresist used as a mask in this etching step may be removed at appropriate timing.

Further, most suitable etching conditions may be selected as appropriate for each of the organic compound layer 12, the release layer 21, and the light shielding layer 22, and thus removal by etching can be performed without a residue.

In the process described above, the organic compound layer 12 is processed. Note that, the step of processing the organic compound layer 12 as well as the step of forming the organic compound layer 12 is required to be repeated as many times as the number of types of the organic compound layers 12 (or sub-pixels).

For example, when the organic EL display device including three types of sub-pixels is produced, first, by a process illustrated in FIGS. 2B to 2G, an organic compound layer 12a of the first color is formed and processed. After that, by a process illustrated in FIGS. 2H and 2I, an organic compound layer 12b of the second color is formed and processed. Subsequently, by a process illustrated in FIGS. 2J and 2K, an organic compound layer 12c of the third color is formed and processed.

(Step of Removing Release Layer and Light Shielding Layer)

After the steps of forming and processing the organic compound layer 12 are performed for all of the sub-pixels, the release layer 21 and the light shielding layer 22 provided on the organic compound layer 12 are removed (FIG. 2L). Examples of the method of removing the release layer 21 and the light shielding layer 22 include a method of dissolving the constituent material for the light shielding layer 22 to remove the light shielding layer 22, and then removing the release layer 21, and a method of dissolving the release layer 21 and simultaneously performing lift-off of the light shielding layer 22 for removal. The method of dissolving the release layer 21 and performing lift-off of the light shielding layer 22 for removal is particularly preferred because the step is simple.

(Step of Forming Electron Injection Transport Layer)

Next, on the organic compound layer 12, the electron injection transport layer 13 is formed (FIG. 2M). The electron injection transport layer 13 is a layer shared by all of the sub-pixels, and may be formed of a single layer or multiple layers, which may be selected as appropriate in consideration of the emission function of the organic EL element. Specific examples of layers forming the electron injection transport layer 13 include an electron transport layer and an electron injection layer. In the present invention, a publicly-known material can be used as a constituent material for the electron injection transport layer 13. Further, the electron injection transport layer 13 is formed by a vacuum evaporation method and the like. Note that, the layer formed after performing the steps of forming and processing the organic compound layer 12 for all of the sub-pixels is not limited to the electron injection transport layer as long as the layer is formed before the second electrode and shared by all of the sub-pixels, and moreover, is not always required to be formed.

(Step of Forming Second Electrode)

Next, the second electrode 14 is formed on the electron injection transport layer 13 (FIG. 2N). The second electrode 14 is an electrode layer shared by all of the sub-pixels, and may be a transparent electrode or a reflective electrode. Further, as a constituent material for the second electrode 14, a material similar to that of the above-mentioned first electrode 11 can be used. Further, the second electrode 14 can be formed with use of a publicly-known technology such as sputtering. Note that, the second electrode 14 is preferred to be formed in a desired region by, for example, masking.

(Step of Forming Sealing Member)

Note that, the organic EL element included in the organic EL display device may be deteriorated due to moisture. Therefore, after the second electrode 14 is formed, it is preferred that a sealing member for preventing intrusion of moisture be provided on the second electrode 14. As the sealing member, for example, there may be used a film-like sealing member of a single film made of a material having a high moisture-proof property, such as silicon nitride and silicon oxide, or a film-like sealing member formed of a laminate of the above-mentioned film. Further, instead of a film-like sealing member, there may be employed a publicly-known sealing structure such as a cap sealing structure in which a circumference of a sealing substrate having a high moisture-proof property, such as glass, is fixed to the substrate 10 with an adhesive or a glass frit.

With the above-mentioned steps, it is possible to produce the organic EL display device in which the organic compound layers (12a, 12b, and 12c) having different properties in, for example, emission color are provided for the respective sub-pixels. Note that, each of the three types of the organic compound layers (12a, 12b, and 12c) illustrated in FIGS. 2A to 2N corresponds to one of the three types of the organic compound layers (12B, 12G, and 12R) illustrated in FIG. 1. Further, when the organic EL display device 1 including the blue organic compound layer 12B, the green organic compound layer 12G, and the red organic compound layer 12R illustrated in FIG. 1 is produced by the manufacturing method of the present invention, the produced organic EL display device 1 can perform full-color display.

Example 1

Through a manufacturing process described below, the organic EL display device 1 illustrated in FIG. 1 was produced.

First, as illustrated in FIG. 2A, on the glass substrate 10 including a thin film transistor circuit (not shown), an Al film and an ITO film were formed in the stated order to form a stacked electrode thin film formed of the Al film and the ITO film. At that time, the thickness of the Al film was set to 100 nm, and the thickness of the ITO film was set to 40 nm. Next, patterning was performed by a photolithography method, and thus the first electrodes 11a, 11b, and 11c were formed (FIG. 2A). Note that, the first electrodes (11a, 11b, and 11c) were each formed to have a size of (width 0.6 µm)×(length 1.8 µm), and were formed at intervals of 0.6 µm. Further, the first electrodes (11a, 11b, and 11c) functioned as the lower electrode. Next, a film made of silicon nitride was formed so as to cover the substrate 10 and the first electrodes (11a, 11b, and 11c), and then the film made of silicon nitride was processed by a photolithography process. With this, an inter-pixel separation film (not shown) made of silicon nitride was formed between the first electrodes 11. The thickness of the inter-pixel separation film at that time was set to 1.5 µm.

Next, on the first electrodes (11a, 11b, and 11c), the blue organic compound layer 12B (corresponding to reference symbol 12a in FIG. 2B) was formed by a vacuum evaporation method (FIG. 2B). Note that, in this example, the blue organic compound layer 12B was formed to have a three layer configuration of the hole injection layer that is brought into contact with the first electrodes (11a, 11b, and 11c), the hole transport layer, and the blue emission layer. As the constituent material for the blue emission layer, a publicly-known low-molecular organic luminescent material that emits blue light (emission wavelength of 430 nm) was used.

Next, a polyvinylpyrrolidone aqueous solution was coated by a spin-coating method, and then heating and drying processing was performed. Thus, the release layer 21 was formed (FIG. 2C). The thickness of the release layer 21 at that time was set to 1.5 µm.

Next, by a CVD method, an amorphous silicon film was formed on the release layer 21 to form the light shielding layer 22 (FIG. 2D). The thickness of the light shielding layer 22 at that time was set to 1 µm. Note that, the light shielding layer 22 formed in this step had a transmittance of about 3% with respect to light in the wavelength range of 190 nm or more and 360 nm or less.

Next, a solution containing a photoresist material was coated on the light shielding layer 22 by a spin-coating method to form a film, and then the film was heated and dried. Thus, the resist layer 23 was formed (FIG. 2E).

Next, with use of the photomask 30 made of Cr and having an aperture in a region other than the region of the blue pixel 2B, exposure was performed while blocking the light 31 emitted from a light source (not shown) by the photomask 30 as appropriate (FIG. 2F). Next, development was performed with an alkaline developer, and thus the part 23a of the resist layer 23 exposed to the light 31 was selectively removed.

Next, with use of the patterned resist layer 23 as a mask, the blue organic compound layer 12B, the release layer 21, and the light shielding layer 22 in a region that is not covered with the resist layer 23 were removed by dry etching. With this, as illustrated in FIG. 2G, the blue organic compound layer 12B, the release layer 21, and the light shielding layer 22 were processed into a desired pattern. Note that, when the dry etching was performed, an RIE device was used. Further, when the light shielding layer 22 was subjected to etching, a $CF_4$ gas was used as an etching gas, and when the release layer 21 and the blue organic compound layer 12B were subjected to etching, an $O_2$ gas was used as an etching gas. In this example, when the region subjected to etching was observed by a microscope after the etching, an etching residue was not found.

Next, the following steps (i) to (v) were repeated twice (FIG. 2H to FIG. 2K). Note that, the layer represented by reference symbol 12b in FIG. 2H corresponds to the green organic compound layer 12G (emission wavelength of 530 nm), and the layer represented by reference symbol 12c in FIG. 2J corresponds to the red organic compound layer 12R (emission wavelength of 620 nm).

(i) a step of forming the organic compound layer (12G or 12R) by a vacuum evaporation method (ii) a step of forming the release layer 21 by a spin-coating method (iii) a step of forming the light shielding layer 22 by a CVD method (iv) a step of forming a photoresist pattern by a photolithography method (v) a step of performing patterning by dry etching With this, a stacked body including the green organic compound layer 12G, the release layer 21, and the light shielding layer 22, and a stacked body including the red organic compound layer 12R, the release layer 21, and the light shielding layer 22 are sequentially formed into a desired pattern (FIG. 2K).

Next, the substrate was immersed in flowing water for 3 minutes, and thus the release layer 21 and the light shielding layer 22 formed on the organic compound layers (12B, 12G, and 12R) were collectively removed (FIG. 2L).

Next, by a CVD method, the electron injection transport layer 13 was formed on the organic compound layers (12B, 12G, and 12R) (FIG. 2M). Note that, in this example, the electron injection transport layer 13 is a stacked body including an electron transport layer that is provided in contact with the organic compound layers (12B, 12G, and 12R), and an electron injection layer, which are stacked in the stated order.

Next, by a sputtering method, an Ag film was formed to form the second electrode 14 (FIG. 2N). Finally, a silicon nitride film having a thickness of 2 μm was formed on the second electrode 14 to form a sealing film (not shown) for moisture intrusion prevention. In this manner, the organic EL display device was obtained.

When the emission state of the organic EL display device produced as described above was observed by a microscope, no display failure such as emission failure was observed, and it was found that, assuming that a set of the sub-pixels emitting light having respective colors of blue, green, and red as one pixel, the pixels were arranged with high resolution of 1.2 μm pitch.

Example 2

An organic EL display device was produced by a method similar to that of Example 1 except that the constituent material for the light shielding layer 22 was set to silicon nitride in the method of Example 1. Note that, in this example, the silicon nitride film formed as the light shielding layer 22 was formed to have a thickness of 2 μm with use of source gases of an $SiH_4$ gas and an $N_2$ gas by a CVD method. Further, when the transmittance of the formed silicon nitride film was measured, the transmittance thereof was about 5% with respect to light in the wavelength range of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask. In the present invention, in the case where the constituent material for the light shielding layer 22 is set to silicon nitride, the thickness of the light shielding layer 22 is preferred to be 2 μm or more.

Example 3

An organic EL display device was produced by a method similar to that of Example 1 except that the constituent material for the light shielding layer 22 was set to a stacked body of amorphous silicon and silicon nitride in the method of Example 1. Note that, in this example, the amorphous silicon film and the silicon nitride film forming the light shielding layer 22 had thicknesses of 0.5 μm and 1.0 μm, respectively. Further, when the transmittance of the above-mentioned stacked body was measured, the transmittance thereof was about 5% with respect to light in the wavelength region of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask.

Example 4

An organic EL display device was produced by a method similar to that of Example 1 except that the constituent material for the light shielding layer 22 was set to amorphous carbon in the method of Example 1. Note that, in this example, the amorphous carbon film formed as the light shielding layer 22 was formed to have a thickness of 2 μm, and was subjected to dry etching using a mixed gas of $CF_4$ and $O_2$ to be processed into a desired shape. Further, when the transmittance of the formed amorphous carbon film was measured, the transmittance thereof was about 5% with respect to light in the wavelength range of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask.

Example 5

An organic EL display device was produced by a method similar to that of Example 1 except that the constituent material for the light shielding layer 22 was set to Al in the method of Example 1. Note that, in this example, the Al film formed as the light shielding layer 22 was formed to have a thickness of 100 nm, and was subjected to dry etching using a mixed gas of $Cl_2$ and $BCl_3$ to be processed into a desired shape. Further, when the transmittance of the formed Al film was measured, the transmittance thereof was 0% with respect to light in the wavelength range of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask.

Example 6

An organic EL display device was produced by a method similar to that of Example 1 except that the constituent material for the light shielding layer 22 was set to Mo in the method of Example 1. Note that, in this example, the Mo film formed as the light shielding layer 22 was formed to have a thickness of 150 nm, and was subjected to dry etching using a mixed gas of $Cl_2$ and $BCl_3$ to be processed into a desired shape. Further, when the transmittance of the formed Mo film was measured, the transmittance thereof was 0% with respect to light in the wavelength range of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask.

Example 7

An organic EL display device was produced by a method similar to that of Example 1 except that the constituent material for the light shielding layer 22 was set to a stacked body of Ti and Al in the method of Example 1. Note that, in this example, the Ti film and the Al film forming the light shielding layer 22 were formed to have thicknesses of 20 nm and 60 nm, respectively, and were subjected to dry etching using a mixed gas of $Cl_2$ and $BCl_3$ to be processed into a desired shape. Further, when the transmittance of the above-mentioned stacked body was measured, the transmittance thereof was about 1% with respect to light in the wavelength range of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask.

Example 8

An organic EL display device was produced by a method similar to that of Example 1 except that the constituent material for the light shielding layer 22 was set to a stacked body in which a Ti layer, an Al layer, and a Ti layer were stacked in the stated order in the method of Example 1. Note that, in this example, the thicknesses of the respective layers forming the light shielding layer 22 were 10 nm (Ti layer), 50 nm (Al layer), and 10 nm (Ti layer), and the layers were subjected to dry etching using a mixed gas of $Cl_2$ and $BCl_3$ to be processed into a desired shape. Further, when the transmittance of the above-mentioned stacked body was measured, the transmittance thereof was about 2% with respect to light in the wavelength range of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask.

Example 9

The constituent material for the light shielding layer 22 and the etching gas used for processing the light shielding layer 22 in the method of Example 1 were changed to materials and gases shown in Table 1 below. An organic EL display device was produced by a method similar to that of Example 1 except for those points.

TABLE 1

| | Constituent material for light shielding layer | Thickness of light shielding layer | Etching gas |
| --- | --- | --- | --- |
| Blue organic compound layer | Al | 100 nm | Mixed gas of $Cl_2$ and $BCl_3$ |
| Green organic compound layer | Amorphous silicon | 1 μm | $CF_4$ gas |
| Red organic compound layer | Silicon nitride | 2 μm | $CF_4$ gas |

In this example, when the transmittances of the light shielding layers formed on the respective organic compound layers were measured, all of the transmittances were 5% or lower with respect to light in the wavelength range of 190 to 360 nm.

When the emission state of the organic EL display device produced as described above was observed by a microscope, no display failure such as emission failure was found. Further, the element efficiency was equivalent to that of an element produced by employing only a vacuum evaporation method and using an evaporation mask.

Example 10

An organic EL display device was produced by a method similar to that of Example 1 except that the constituent material for the light shielding layer 22 was set to phthalocyanine in the method of Example 1. Note that, in this example, a phthalocyanine film forming the light shielding layer 22 was formed to have a thickness of 3 μm, and was subjected to dry etching using an $O_2$ gas to be processed into a desired shape. Further, when the transmittance of the formed phthalocyanine film was measured, the transmittance thereof was about 5% with respect to light in the wavelength range of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask.

Example 11

The constituent material for the light shielding layer 22 and the etching gas used for processing the light shielding layer 22 in the method of Example 1 were changed to materials and gases shown in Table 2 below. An organic EL display device was produced by a method similar to that of Example 1 except for those points.

TABLE 2

| | Constituent material for light shielding layer | Thickness of light shielding layer | Etching gas |
|---|---|---|---|
| Blue organic compound layer | Porphyrin | 3 μm[Note 1] | $O_2$ gas |
| Green organic compound layer | Polyparaphenylene vinylene | 2 μm[Note 2] | $O_2$ gas |
| Red organic compound layer | Pentacene | 3 μm[Note 1] | $O_2$ gas |

[Note 1] Film formation by CVD method
[Note 2] Film formation by slit-coating method In this example, when the transmittances of the light shielding layers formed on the respective organic compound layers were measured, all of the transmittances were 5% or lower with respect to light in the wavelength range of 190 nm or more and 360 nm or less.

When the emission state of the organic EL display device produced as described above was observed by a microscope, no display failure such as emission failure was found. Further, the element efficiency was equivalent to that of an element produced by employing only a vacuum evaporation method and using an evaporation mask.

Example 12

An organic EL display device was produced by a method similar to that of Example 1 except that the constituent material for the light shielding layer 22 was set to a material (mixed material) in which porphyrin, pentacene, and phthalocyanine were mixed in a ratio of 1:1:1 in the method of Example 1. Note that, in this example, a film made of the mixed material and forming the light shielding layer 22 was formed to have a thickness of 3 μm by a CVD method, and was subjected to dry etching using an $O_2$ gas to be processed into a desired shape. Further, when the transmittance of the formed film was measured, the transmittance thereof was about 5% with respect to light in the wavelength range of 190 nm or more and 360 nm or less.

When the organic EL display device produced as described above was observed by a microscope similarly to the case of Example 1, no display failure such as emission failure was found. Further, the luminous efficiency of the organic EL element forming the organic EL display device of this example was equivalent to that of the organic EL element produced by employing a vacuum evaporation method and using an evaporation mask.

Comparative Example 1

An organic EL display device was produced by a method similar to that of Example 1 except that the constituent material for the light shielding layer 22 was set to silicon nitride in the method of Example 1. Note that, in this comparative example, the silicon nitride film formed as the light shielding layer 22 was formed to have a thickness of 1.6 μm by a CVD method. Further, when the transmittance of the formed silicon nitride film was measured, the transmittance thereof was about 10% with respect to light in the wavelength range of 190 nm or more and 360 nm or less.

When the organic EL display device produced as described above was observed by a microscope similarly to the case of Example 1, a non-emitting pixel was found. Further, the organic EL element forming the organic EL display device of this comparative example was lower in luminous efficiency than the organic EL element produced by employing a vacuum evaporation method and using an evaporation mask.

Comparative Example 2

An organic EL display device was produced by a method similar to that of Example 1 except that the constituent material for the light shielding layer 22 was set to silicon nitride in the method of Example 1. Note that, in this comparative example, the silicon nitride film formed as the light shielding layer 22 was formed to have a thickness of 0.7 μm by a CVD method. Further, when the transmittance of the formed silicon nitride film was measured, the transmittance thereof was about 50% with respect to light in the wavelength range of 190 nm or more and 360 nm or less.

When the organic EL display device produced as described above was observed by a microscope similarly to the case of Example 1, a non-emitting pixel was found. Further, the organic EL element forming the organic EL display device of this comparative example was lower in luminous efficiency than the organic EL element produced by employing a vacuum evaporation method and using an evaporation mask.

Comparative Example 3

An organic EL display device was produced by a method similar to that of Example 1 except that the constituent material for the light shielding layer 22 was set to silicon oxide in the method of Example 1. Note that, in this comparative example, the silicon oxide film formed as the light shielding layer 22 was formed to have a thickness of 0.3 μm by a CVD method. Further, when the transmittance of the formed silicon oxide film was measured, the transmittance thereof exceeded 80% with respect to light in the wavelength range of 190 nm or more and 360 nm or less.

When the organic EL display device produced as described above was observed by a microscope similarly to the case of Example 1, a non-emitting pixel was found. Further, the organic EL element forming the organic EL display device of this comparative example was lower in luminous efficiency than the organic EL element produced by employing a vacuum evaporation method and using an evaporation mask.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-217678, filed Sep. 30, 2011, and No.

2012-191772, filed Aug. 31, 2012, which are hereby incorporated by reference herein in their entirety.

What is claimed is:

1. A method of manufacturing an organic electroluminescence display device including multiple organic electroluminescence elements each including an organic compound layer that includes at least an emission layer, the method comprising:
forming the organic compound layer on a substrate;
sequentially forming an intermediate layer and a resist layer on the organic compound layer;
removing a part of the resist layer by a photolithography method; and
selectively removing, by dry etching, the intermediate layer and the organic compound layer in a region in which the part of the resist layer is removed,
wherein the intermediate layer includes a release layer and a light shielding layer, the release layer is provided between the light shielding layer and the organic compound layer, and the light shielding layer has a function of blocking light having a wavelength of 190 nm or more and 360 nm or less.

2. The method according to claim 1, wherein the light shielding layer is set to have a transmittance of 5% or less with respect to the light having the wavelength of 190 nm to 360 nm.

3. The method according to claim 1, wherein the light shielding layer has a stacked configuration of multiple layers.

4. The method according to claim 1, wherein the light shielding layer includes a film made of silicon nitride and has a thickness of 2 μm or more.

5. The method according to claim 1, wherein
the release layer is made of a material soluble in a solvent which hardly dissolves a constituent material for the organic compound layer.

6. The method according to claim 5, wherein the constituent material for the organic compound layer includes any one of an arylamine derivative, a stilbene derivative, polyarylene, and a fused polycyclic hydrocarbon compound, and wherein the release layer is made of a material that is soluble in water.

7. The method according to claim 6, wherein the release layer is made of a water-soluble polymer.

8. The method according to claim 5, further comprising, after the selectively removing, by dry etching, the intermediate layer and the organic compound layer in the region in which the part of the resist layer is removed, dissolving the release layer and performing lift off of the light shielding layer for removal.

9. The method according to claim 1, the organic electroluminescence display device including multiple first organic electroluminescence elements and multiple second organic electroluminescence elements in each of which one of a layer configuration and an emission color of the organic compound layer is different from the one of the layer configuration and the emission color of the organic compound layer of each of the multiple first organic electroluminescence elements,
wherein the method comprises performing each of the following steps multiple times:
the forming the organic compound layer;
the sequentially forming the intermediate layer and the resist layer on the organic compound layer;
the removing the part of the resist layer; and
the selectively removing, by dry etching, the intermediate layer and the organic compound layer in the region in which the part of the resist layer is removed.

* * * * *